US008507952B2

(12) United States Patent
Yamanaka et al.

(10) Patent No.: US 8,507,952 B2
(45) Date of Patent: Aug. 13, 2013

(54) SEMICONDUCTOR WAFER, SEMICONDUCTOR DEVICE, AND METHOD FOR PRODUCING SEMICONDUCTOR WAFER

(75) Inventors: Sadanori Yamanaka, Chiba (JP); Tomoyuki Takada, Tsukuba (JP); Masahiko Hata, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/495,746

(22) Filed: Jun. 13, 2012

(65) Prior Publication Data
US 2012/0267688 A1 Oct. 25, 2012

Related U.S. Application Data

(63) Continuation-in-part of application No. PCT/JP2010/007005, filed on Dec. 1, 2010.

(30) Foreign Application Priority Data

Dec. 15, 2009 (JP) ................. 2009-284279

(51) Int. Cl.
*H01L 21/02* (2006.01)
(52) U.S. Cl.
USPC ............ 257/200; 257/613; 257/E29.022; 257/E29.081; 257/E21.129; 438/478
(58) Field of Classification Search
USPC ............ 257/200, 613, E29.022, E29.081, 257/E21.129; 438/478
See application file for complete search history.

(56) References Cited

U.S. PATENT DOCUMENTS

| 4,346,513 | A | 8/1982 | Nishizawa et al. |
| 6,531,351 | B2 | 3/2003 | Gao et al. |
| 7,626,246 | B2 * | 12/2009 | Lochtefeld et al. ........... 257/647 |
| 2002/0024094 | A1 | 2/2002 | Gao et al. |
| 2006/0244068 | A1 | 11/2006 | Desouza et al. |
| 2007/0181977 | A1 | 8/2007 | Lochtefeld et al. |
| 2009/0095981 | A1 | 4/2009 | Kang et al. |
| 2011/0006343 | A1 | 1/2011 | Hata et al. |

FOREIGN PATENT DOCUMENTS

| JP | 55-160443 A | 12/1980 |
| JP | 2001-093987 A | 4/2001 |
| JP | 2008-539593 A | 11/2008 |
| JP | 2009-503871 A | 1/2009 |
| JP | 2009-099956 A | 5/2009 |
| JP | 2009-239270 A | 10/2009 |

OTHER PUBLICATIONS

Translation of the International Preliminary Report on Patentability, dated Jul. 19, 2012, issued by the International Bureau in International Application No. PCT/JP2010/007005.

* cited by examiner

*Primary Examiner* — Tu-Tu Ho
(74) *Attorney, Agent, or Firm* — Sughrue Mion, PLLC

(57) ABSTRACT

To improve the flatness of the surface and improve the reliability of a semiconductor device when expitaxially growing semiconductor crystal layers of different types on a single silicon wafer, provided is a semiconductor wafer which includes: a base wafer having a silicon crystal in the surface thereof, the silicon crystal having a first dent and a second dent; a first Group IVB semiconductor crystal located in the first dent and exposed; a second Group IVB semiconductor crystal located in the second dent; and a Group III-V compound semiconductor crystal located above the second Group IVB semiconductor crystal in the second dent and exposed.

24 Claims, 6 Drawing Sheets

SEMICONDUCTOR WAFER, SEMICONDUCTOR DEVICE, AND METHOD FOR PRODUCING SEMICONDUCTOR WAFER

The contents of the following Japanese patent application and PCT patent application are incorporated herein by reference:
JP2009-284279 filed on Dec. 15, 2009, and
PCT/JP2010/007005 filed on Dec. 1, 2010.

BACKGROUND

1. Technical Field

The present invention relates to a semiconductor wafer, a semiconductor device, and a method of producing a semiconductor wafer.

2. Related Art

Patent Document 1 discloses a CMOS integrated circuit having GaAs/Ge crystal grown on a GaAs layer formed on an Si wafer. In this CMOS integrated circuit, a GaAs well is used as an N-channel device, and a Ge well is used as a P-channel device. An oxide is formed between the GaAs well and the Ge well to separate them, and a semi-insulating (undoped) layer made of GaAs is formed between the GaAs and Ge wells and Si to eliminate the possibility of latch-up.
(Patent Document 1) Japanese Patent Application Publication No. 2001-93987

SUMMARY

Problem to be Solved by the Invention

When a GaAs layer is formed on an Si wafer, a crystal defect occurs in the GaAs layer due to the difference between the lattice spacing of Si and the lattice spacing of GaAs. If GaAs crystal and Ge crystal are grown on a GaAs layer having a crystal defect, a crystal defect also occurs in the GaAs crystal and the Ge crystal. Because the mobility of electrons and holes lowers if a crystal defect occurs in the GaAs crystal and the Ge crystal, it is difficult to configure a CMOS circuit which switches at a high speed by using such a GaAs crystal and Ge crystal.

It has been found by researches conducted by the present inventors that it is possible to suppress occurrence of a crystal defect, contaminants, and particles by forming a semiconductor crystal layer in a minute region by using a selective epitaxial growth method. However, when a semiconductor crystal layer is formed by selective epitaxial growth, unevenness occurs in the surface between the region in which the semiconductor crystal layer is formed and a region in which no semiconductor crystal layer is formed. If a great unevenness exists, this becomes a factor of breaking wires, etc. formed so as to extend across the unevenness. Because this might be the cause for lowering the reliability of the semiconductor device, it is desirable to reduce the size of the unevenness.

Means for Solving the Problem

For a solution to the above-mentioned problems, according to the first aspect related to the present invention, provided is one exemplary semiconductor wafer, including: a base wafer having a silicon crystal in a surface thereof, the silicon crystal having a first dent and a second dent; a first Group IVB semiconductor crystal located in the first dent and exposed; a second Group IVB semiconductor crystal located in the second dent; and a Group III-V compound semiconductor crystal located above the second Group IVB semiconductor crystal in the second dent and exposed. In the semiconductor wafer, the first Group IVB semiconductor crystal is a crystal of $Si_{1-a1}Ge_{a1}$ ($0 \leq a1 \leq 1$), and the second Group IVB semiconductor crystal is a crystal of $Si_{1-a2}Ge_{a2}$ ($0.6 \leq a2 \leq 1$). a1 and a2 may satisfy $a1 \leq a2$.

In the semiconductor wafer, for example, the surface of the silicon crystal, the surface of the first Group IVB semiconductor crystal, and the surface of the Group III-V compound semiconductor crystal are located on substantially the same plane. The first dent may be shallower than the second dent. The first dent and the second dent may have substantially the same depth, and the second Group IVB semiconductor crystal may be thinner than the first Group IVB semiconductor crystal. For example, the aspect ratio of the second dent is $(\sqrt{3})/3$ or higher.

The semiconductor wafer may further include an inhibition member located between the side wall of the first dent and the first Group IVB semiconductor crystal, the inhibition member inhibiting growth of a semiconductor crystal. The semiconductor wafer may further include an inhibition member located between the side wall of the second dent and the second Group IVB semiconductor crystal and between the side wall of the second dent and the Group III-V compound semiconductor crystal, the inhibition member inhibiting growth of a semiconductor crystal. The semiconductor wafer may further include a third Group IVB semiconductor crystal that is located on a region of the silicon crystal that is different from the regions in which the first dent and the second dent are located. For example, the third Group IVB semiconductor crystal is a crystal of $Si_{1-b}Ge_b$ ($0 \leq b \leq 1$). For example, the Group III-V compound semiconductor crystal is a crystal of $Al_xIn_yGa_{1-x-y}As_zP_{1-z}$ ($0 \leq x \leq 1$, $0 \leq y \leq 1$, $0 \leq x+y \leq 1$, $0 \leq z \leq 1$).

According to the second aspect related to the present invention, a semiconductor wafer includes: a base wafer having a silicon crystal in a surface thereof; an inhibition member that is located on the base wafer, has a first opening leading to the silicon crystal, a second opening leading to the silicon crystal, and a third opening leading to the silicon crystal, and inhibits growth of a semiconductor crystal; a first Group IVB semiconductor crystal located in the first opening and exposed; a second Group IVB semiconductor crystal located in the second opening; a Group III-V compound semiconductor crystal located above the second Group IVB semiconductor crystal and exposed; and a third Group IVB semiconductor crystal located in the third opening. In the semiconductor wafer, for example, the first Group IVB semiconductor crystal is a crystal of $Si_{1-a1}Ge_{a1}$ ($0 \leq a1 \leq 1$), and the second Group IVB semiconductor crystal is a crystal of $Si_{1-a2}Ge_{a2}$ ($0.6 \leq a2 \leq 1$).

In the semiconductor wafer, for example, the surface of the third Group IVB semiconductor crystal, the surface of the first Group IVB semiconductor crystal, and the surface of the Group III-V compound semiconductor crystal are located on substantially the same plane. In the semiconductor wafer, the second Group IVB semiconductor crystal may be thinner than the first Group IVB semiconductor crystal.

According to the third aspect related to the present invention, a semiconductor device includes an electronic element which includes: any semiconductor crystal among the silicon crystal, the first Group IVB semiconductor crystal, the second Group IVB semiconductor crystal, and the Group III-V compound semiconductor crystal of the semiconductor wafer described above; and an electrode located on the semiconductor crystal or on a semiconductor layer located on the semiconductor crystal.

According to the fourth aspect related to the present invention, a method for producing a semiconductor wafer includes: forming a first dent and a second dent in a silicon crystal of a base wafer that has the silicon crystal in a surface thereof; forming a first Group IVB semiconductor crystal in the first dent; forming a second Group IVB semiconductor crystal in the second dent; and forming a Group III-V compound semiconductor crystal above the second Group IVB semiconductor crystal in the second dent, wherein the first Group IVB semiconductor crystal and the Group III-V compound semiconductor crystal are exposed. In the method for producing a semiconductor wafer, for example, the first Group IVB semiconductor crystal is a crystal of $Si_{1-a1}Ge_{a1}$ ($0 \leq a1 \leq 1$), and the second Group IVB semiconductor crystal is a crystal of $Si_{1-a2}Ge_{a2}$ ($0.6 \leq a2 \leq 1$).

The method for producing a semiconductor wafer may further include, forming an inhibition member on the surface of the silicon crystal and on the side walls of the first dent and the second dent after forming the first dent and the second dent and before forming the first Group IVB semiconductor crystal and the second Group IVB semiconductor crystal, the inhibition member being to inhibit growth of a semiconductor crystal, wherein in the forming the first Group IVB semiconductor crystal and the second Group IVB semiconductor crystal, the first Group IVB semiconductor crystal and the second Group IVB semiconductor crystal may be formed by a selective MOCVD method. The method for producing a semiconductor wafer may further include forming an inhibition member that covers the surface of the first Group IVB semiconductor crystal formed in the first dent and inhibits growth of a semiconductor crystal, wherein in the fanning the Group III-V compound semiconductor crystal, the Group III-V compound semiconductor crystal may be firmed by a selective MOCVD method.

According to the fifth aspect related to the present invention, a method for producing a semiconductor wafer includes: forming an inhibition member on a base wafer having a silicon crystal in a surface thereof, the inhibition member inhibiting growth of a semiconductor crystal; forming a first opening, a second opening, and a third opening in the inhibition member, the first opening leading to the silicon crystal, the second opening leading to the silicon crystal, and the third opening leading to the silicon crystal; forming a first Group IVB semiconductor crystal in the first opening; forming a second Group IVB semiconductor crystal in the second opening; forming a Group III-V compound semiconductor crystal above the second Group IVB semiconductor crystal in the second opening; and growing a third Group IVB semiconductor crystal in the third opening, wherein the first Group IVB semiconductor crystal, the Group III-V compound semiconductor crystal, and the third Group IVB semiconductor crystal are exposed.

In the method for producing a semiconductor wafer, for example, the first Group IVB semiconductor crystal is a crystal of $Si_{1-a1}Ge_{a1}$ ($0 \leq a1 \leq 1$), and the second Group IVB semiconductor crystal is a crystal of $Si_{1-a2}Ge_{a2}$ ($0.6 \leq a2 \leq 1$). For example, for example, the third Group NB semiconductor crystal is a crystal of $Si_{1-b}Ge_b$ ($0 \leq b \leq 1$).

DESCRIPTION OF EXEMPLARY EMBODIMENTS

Figure 1A:
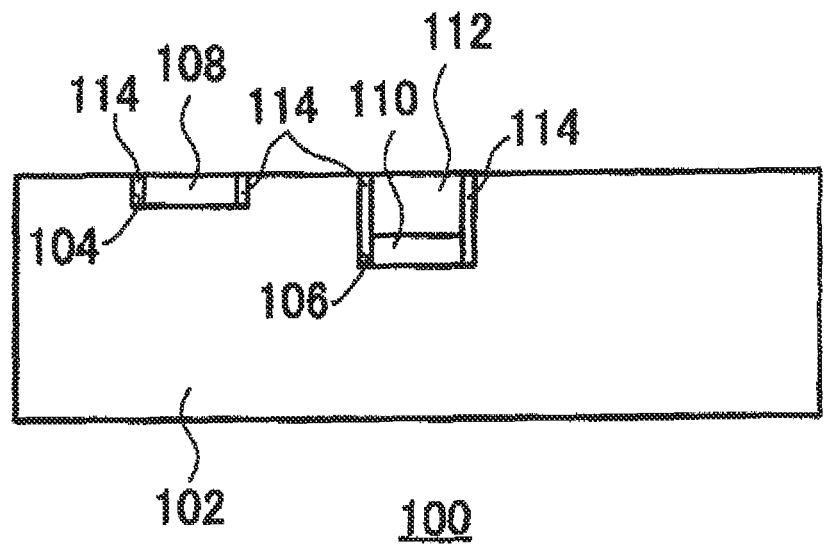
FIG. 1A shows an example of a cross section of a semiconductor wafer 100.
Figure 1B:
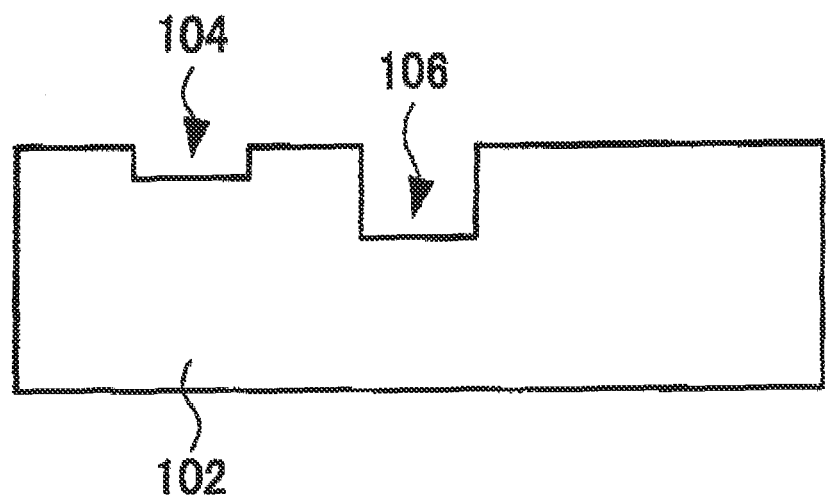
FIG. 1B shows an example of a cross section of the semiconductor wafer 100 during a production process.

The present invention will now be described through embodiments of the invention. FIG. 1A shows an example of a cross section of a semiconductor wafer 100. FIG. 1B to FIG. 1E show an example of a cross section of the semiconductor wafer 100 during a production process. The semiconductor wafer 100 includes a base wafer 102, a first Group IVB semiconductor crystal 108, a second Group IVB semiconductor crystal 110, a Group III-V compound semiconductor crystal 112, and an inhibition member 114. The base wafer 102 has a first dent 104 and a second dent 106.

The base wafer 102 has a silicon crystal in the surface thereof. The base wafer 102 having a silicon crystal in the surface thereof may be an SOI (Silicon-On-Insulator) wafer made of silicon crystal in the vicinity of the surface, and a silicon wafer made of silicon crystal throughout the bulk thereof. FIG. 1A shows an example in which a silicon wafer is used as the based wafer 102.

The first Group IVB semiconductor crystal 108 is located in the first dent 104, and the second Group IVB semiconductor crystal 110 is located in the second dent 106. The second Group III-V compound semiconductor crystal 112 is located above the second Group IVB semiconductor crystal 110 in the second dent 106. Examples of the Group III-V compound semiconductor crystal 112 include a crystal of $Al_xIn_yGa_{1-x-y}As_zP_{1-z}$ ($0 \leq x \leq 1$, $0 \leq y \leq 1$, $0 \leq x+y \leq 1$, $0 \leq z \leq 1$). The first Group IVB semiconductor crystal 108 and the Group III-V compound semiconductor crystal 112 are exposed.

The first Group IVB semiconductor crystal 108 is, for example, a crystal of $Si_{1-a1}Ge_{a1}$ ($0 \leq a1 \leq 1$). The second Group IVB semiconductor crystal 110 is, for example, a crystal of $Si_{1-a2}Ge_{a2}$ ($0 \leq a2 \leq 1$). The first Group IVB semiconductor crystal 108 is preferably a crystal of $Si_{1-a1}Ge_{a1}$ ($0.6 \leq a1 \leq 1$). The second Group IVB semiconductor crystal 110 is preferably a crystal of $Si_{1-a2}Ge_{a2}$ ($0.6 \leq a2 \leq 1$). More preferably, the first Group IVB semiconductor crystal 108 and the second Group IVB semiconductor crystal 110 are Ge crystals.

The ratio of Ge in the second Group IVB semiconductor crystal 110 may be larger than the ratio of Ge in the first Group IVB semiconductor crystal 108. Specifically, a1 and a2 may satisfy $a1 \leq a2$ in the above composition formulae. in this case, it is possible to lattice-match the second Group IVB semiconductor crystal 110 with the Group III-V compound semiconductor crystal 112, and to optimize the carrier mobility in the first Group IVB semiconductor crystal 108.

By using the semiconductor wafer 100, it is possible to configure a semiconductor device having a high-performance electronic element. Specifically, this electronic element includes any semiconductor crystal among the first Group IVB semiconductor crystal 108, the second Group IVB semiconductor crystal 110, and the Group III-V compound semiconductor crystal 112, and an electrode located on this semiconductor crystal or on a semiconductor layer located on this semiconductor crystal. This electronic element may include a metal wiring between any semiconductor crystal among the first Group IVB semiconductor crystal 108, the second Group IVB semiconductor crystal 110, and the Group III-V compound semiconductor crystal 112, and the electrode.

When a Ge crystal is used as the first Group IVB semiconductor crystal 108, it is possible to form a P-channel type MOSFET that operates at a high speed, because a semiconductor element using a Ge crystal as its active layer has a high hole mobility. When a Ge crystal is used as the second Group IVB semiconductor crystal 110, it is possible to grow the Group III-V compound semiconductor crystal 112 to have a good crystallinity, because it is possible to lattice-match the second Group IVB semiconductor crystal 110 with the Group III-V compound semiconductor crystal 112 if this Group III-V compound semiconductor crystal 112 is made of GaAs. Because a high electron mobility can be realized in the Group III-V compound semiconductor crystal 112 having a good crystallinity, it is possible to form an N-channel type MOSFET that operates at a high speed. By forming a P-channel type MOSFET that operates at a high speed and an N-channel type MOSFET that operates at a high speed, it is possible to form a high-performance CMOSFET on the semiconductor wafer 100.

The semiconductor wafer 100 may further include a crystal located between the second Group IVB semiconductor crystal 110 and the Group III-V compound semiconductor crystal 112, and having a composition different from that of the second Group IVB semiconductor crystal 110 and that of the Group III-V compound semiconductor crystal 112. This crystal is, for example, a Group II-VI compound semiconductor crystal. The Group II-VI compound semiconductor crystal is, for example, a crystal of $Mg_tZn_uCd_{1-t-u}S_vSe_wTe_{1-v-w}$ ($0 \leq t \leq 1$, $0 \leq u \leq 1$, $0 \leq t+u \leq 1$, $0 \leq v \leq 1$, $0 \leq w \leq 1$, $0 \leq v+w \leq 1$).

In the semiconductor wafer 100 according to the present embodiment, because the single silicon wafer on which different types of semiconductor crystal layers are epitaxially grown can have an improved flatness, it is possible to improve the reliability of the semiconductor device. Specifically, because the first Group IVB semiconductor crystal 108 is located in the first dent 104 and the second Group IVB semiconductor crystal 110 and Group III-V compound semiconductor crystal 112 are located in the second dent 106, it is possible to reduce the amount by which the first Group IVB semiconductor crystal 108 and the Group III-V compound semiconductor crystal 112 protrude from the surface of the semiconductor wafer 100. As a result, it is possible to prevent breaking of a wiring due to unevenness among the silicon crystal of the base wafer 102, the first Group IVB semiconductor crystal 108, and the Group III-V compound semiconductor crystal 112.

It is more preferable that the surface of the silicon crystal of the base wafer 102, the surface of the first Group IVB semiconductor crystal 108, and the surface of the Group III-V compound semiconductor crystal 112 be located on substantially the same plane, because no semiconductor crystal layer protrude from the surface of the semiconductor wafer 100. In order to locate the silicon crystal of the base wafer 107, the first Group IVB semiconductor crystal 108, and the Group III-V compound semiconductor crystal 112 on substantially the same plane, it is preferable that the first dent 104 be shallower than the second dent 106.

It is preferable that the inhibition member 114 be located between the side wall of the first dent 104 and the first Group IVB semiconductor crystal 108. Further, it is preferable that the inhibition member 114 be located between the side wall of the second dent 106 and the second Group IVB semiconductor crystal 110 and between the side wall of the second dent 106 and the Group III-V compound semiconductor crystal 112. The inhibition member 114 inhibits the growth of semiconductor crystal.

When the second Group IVB semiconductor crystal 110 located in the second dent 106 is not heated to approximately 600 to 900° C., it is preferable that, for example, the second dent 106 have an aspect ratio of $(\sqrt{3})/3$ or higher. More specifically, when the plane direction of the silicon at the bottom plane of the second dent 106 is (100) or (110), the second dent 106 may have an aspect ratio of 1 or higher. When the plane direction of the silicon crystal at the bottom plane of the second dent 106 is (111), the second dent 106 may have an aspect ratio of $\sqrt{2}$ (=approximately 1.414) or higher.

When the second Group IVB semiconductor crystal 110 is formed in the second dent 106 having an aspect ratio of $(\sqrt{3})/3$ or higher, any defect included in the second Group IVB semiconductor crystal 110 is terminated at the side wall of the second dent 106. As a result, it is possible to reduce any defects to be exposed at the surface of the second Group IVB semiconductor crystal 110 as not covered by the side wall of the second dent 106. That is, when the second dent 106 has an aspect ratio of $(\sqrt{3})/3$ or higher, the defect density on the surface of the second Group IVB semiconductor crystal 110 that is exposed in the second dent 106 can be reduced to a prescribed range of tolerance, even when the second Group IVB semiconductor crystal 110 located in the second dent 106 is not annealed. As a result, the crystallinity of the Group III-V compound semiconductor crystal 112 to be grown above the second Group IVB semiconductor crystal 110 is improved.

In the present specification, the "aspect ratio of a dent" is a value obtained by dividing the "depth of the dent" by the "width of the dent". For example, page 751 of 'Handbook of Electronic, Information and Communication, first edition' edited by Institute of Electronics, Information and Communication Engineers (1988, published by Ohmsha, Ltd.) defines that an aspect ratio is "etching depth/pattern width". In the present specification, the term "aspect ratio" is used in the same meaning. The "depth of a dent" is the depth of the dent in the layering direction for layering thin films on a wafer. The "width of a dent" is the width of the dent in the direction perpendicular to the layering direction. When the width of a dent is not constant, the "width of the dent" means the minimum width of the dent. For example, when the shape of a dent seen in the layering direction is a rectangle, the "width of the dent" is the length of the shorter sides of the rectangle.

Next, a method for producing the semiconductor wafer 100 will be described. As shown in FIG. 18, the first dent 104 and the second dent 106 are formed in the silicon crystal of the base wafer 102. The first dent 104 and the second dent 106 can be formed by dry etching or wet etching. The processing accuracy of dry etching is higher than that of wet etching. In contrast, any damage to be given to the silicon crystal by wet etching processing is less severe than that to be given to the silicon wafer by dry etching processing. Hence, when forming the first dent 104 and the second dent 106 by etching, it is preferable that dry etching with a better processing accuracy be performed first, and wet etching to give less severe damage to the silicon crystal be performed next. By performing etching in this order, it is possible to further improve the quality of the semiconductor crystal to be grown in the first dent 104 and the second dent 106.

Figure 1C:
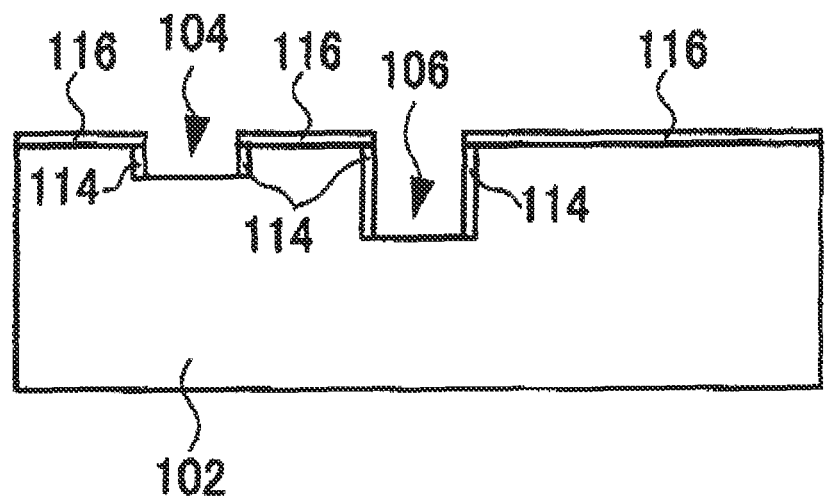
FIG. 1C shows an example of a cross section of the semiconductor wafer 100 during a production process.

Next, as shown in FIG. 1C, the inhibition member 114 is formed on the side walls of the first dent 104 and the second dent 106, and an inhibition member 116 is formed on the surface of the silicon crystal. The inhibition member 114 and the inhibition member 116 inhibit the growth of a semiconductor crystal. The inhibition member 114 is made of, for example, silicon nitride. The inhibition member 116 is made of, for example, silicon oxide.

Figure 1D:
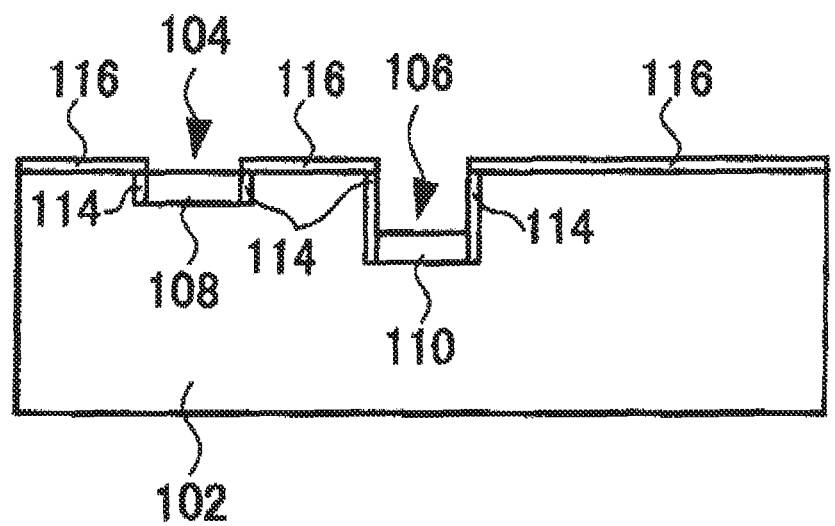
FIG. 1D shows an example of a cross section of the semiconductor wafer 100 during the production process.

Next, as shown in FIG. 1D, the first Group IVB semiconductor crystal 108 is formed in the first dent 104, and the second Group IVB semiconductor crystal 110 is formed in the second dent 106. The first Group IVB semiconductor crystal 108 and the second Group IVB semiconductor crystal 110 are formed by a selective MOCVD method. When the composition of the first Group IVB semiconductor crystal 108 and that of the second Group IVB semiconductor crystal 110 are different, the first Group IVB semiconductor crystal 108 may be grown in the first dent 104 by a first step of MOCVD, and then the second Group IVB semiconductor crystal 110 may be grown in the second dent 106 by a second step of MOCVD.

Figure 1E:
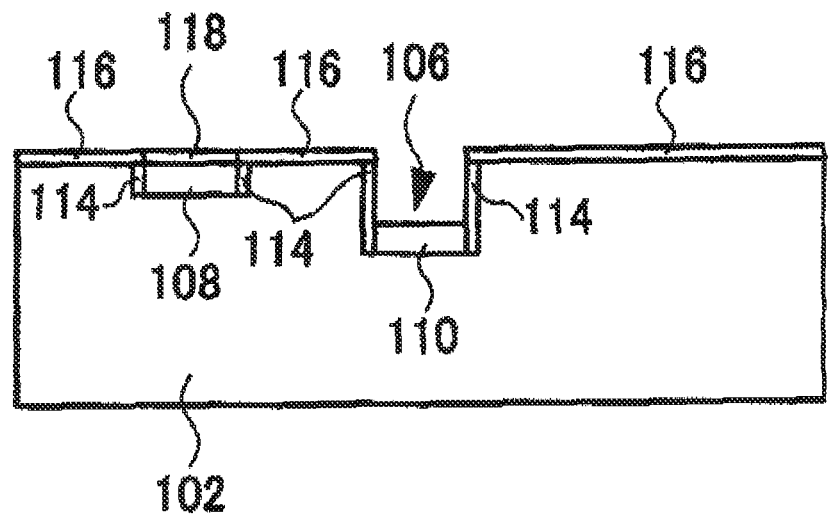
FIG. 1E shows an example of a cross section of the semiconductor wafer 100 during the production process.

Next, as shown in FIG. 1E, an inhibition member 118 to cover the surface of the first Group IVB semiconductor crystal 108 formed in the first dent 104 is formed. After this, the Group III-V compound semiconductor crystal 112 is formed above the second Group IVB semiconductor crystal 110 formed in the second dent 106. The Group III-V compound semiconductor crystal 112 is formed by a selective MOCVD method. The inhibition member 116 and the inhibition member 118 are removed by etching, and hence the semiconductor wafer 100 is completed. When the Group III-V compound semiconductor crystal 112 protrudes from the surface of the base wafer 102, the portion of the Group III-V compound semiconductor crystal 112 that protrudes from the surface of the base wafer 102 may be removed by etching.

The inhibition member 116 and the inhibition member 118, and the portion of the Group III-V compound semiconductor crystal 112 that protrudes from the surface of the base wafer 102 may be removed by a CMP method. After the inhibition member 116 and the inhibition member 118 are removed by etching, the portion of the Group III-V compound semiconductor crystal 112 that protrudes from the surface of the base wafer 102 may be removed by a CMP method. By removing the portion of the Group III-V compound semiconductor crystal 112 that protrudes from the surface of the base wafer 102, it is possible to locate the surface of the silicon crystal of the base wafer 102, the surface of the first Group IVB semiconductor crystal 108, and the surface of the Group III-V compound semiconductor crystal 112 on the same plane.

When the position of the surface of the Group III-V compound semiconductor crystal 112 is closer to the position of the surface of the second Group IVB semiconductor crystal 110 than to the position of the surface of the base wafer 102, a partial region of the silicon crystal of the base wafer 102 and a partial region of the first Group IVB semiconductor crystal 108 may be removed by a CMP method in order to locate the surface of the silicon crystal, the surface of the first Group IVB semiconductor crystal 108, and the surface of the Group III-V compound semiconductor crystal 112 on the same plane.

As described above, in the semiconductor wafer 100, the surface of the silicon crystal of the base wafer 102, the surface of the first Group IVB semiconductor crystal 108, and the surface of the Group III-V compound semiconductor crystal 112 are formed on substantially the same plane, which makes it possible to reduce the size of unevenness, which leads to prevention of breaking of a wiring, etc.

Figure 1F:
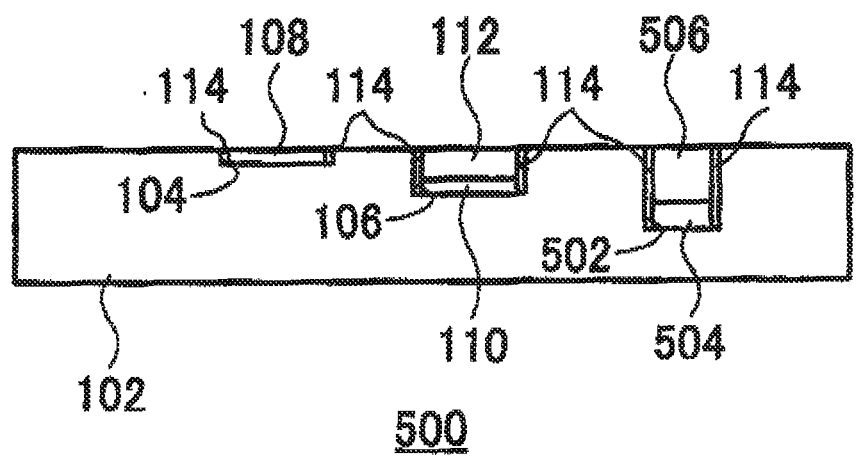
FIG. 1F shows an example of a cross section of a semiconductor wafer 500.

FIG. 1F shows an example of a cross section of a semiconductor wafer 500 according to another embodiment. The semiconductor wafer 500 is different from the semiconductor wafer 100 shown in FIG. 1A in having a sacrifice growth dent 502. The semiconductor wafer 500 includes a Group IVB semiconductor 504 located in the sacrifice growth dent 502 and formed simultaneously with the first Group IVB semiconductor crystal 108 or the second Group IVB semiconductor crystal 110, and includes a Group III-V semiconductor 506 located above the Group IVB semiconductor 504 and formed simultaneously with the Group III-V compound semiconductor crystal 112. An inhibition member 114 may be located on the side wall of the sacrifice growth dent 502.

When the first Group IVB semiconductor crystal 108, the second Group IVB semiconductor crystal 110, and the Group III-V compound semiconductor crystal 112 are formed by selective epitaxial growth, the materials of these semiconductor crystals are also adsorbed to the bottom plane of the sacrifice growth dent 502 simultaneously, to form semiconductor films. The Group IVB semiconductor 504 or the Group III-V semiconductor 506, which is the semiconductor film to be formed in the sacrifice growth dent 502, needs not have the same crystal quality as that of the first Group IVB semiconductor crystal 108 or second Group IVB semiconductor crystal 110, or the Group III-V compound semiconductor crystal 112, and may be polycrystalline or amorphous.

By providing the sacrifice growth dent 502 which is a sacrifice growth portion in the base wafer 102, it is possible to epitaxially grow the first Group IVB semiconductor crystal 108, the second Group IVB semiconductor crystal 110, or the Group III-V compound semiconductor crystal 112 at a stable growth speed. Further, it is possible to easily control the thickness of the semiconductor crystals to be epitaxially grown, in accordance with the volume of the semiconductor films to be grown in the sacrifice growth portion. For example, by adding the sacrifice growth dent 502 to the semiconductor wafer 100 shown in FIG. 1A, it is possible to reduce the growth speed of the first Group IVB semiconductor crystal 108, the second Group IVB semiconductor crystal 110, or the Group III-V compound semiconductor crystal 112. As a result, the degree of latitude in designing the semiconductor wafer 500 and a semiconductor device using the semiconductor wafer 500 is improved.

Further, because the provision of the sacrifice growth dent 502 to the semiconductor wafer 500 makes it easy to control the epitaxial growth speed, it becomes easy to align the height of the surface of the first Group IVB semiconductor crystal 108 and the surface of the Group III-V compound semiconductor crystal 112 with the height of the surface of the silicon crystal. As a result, it is possible to improve the surface flatness of the semiconductor wafer 500 without removing the first Group IVB semiconductor crystal 108 and the Group III-V compound semiconductor crystal 112 by etching or a CMP method. Because the sacrifice growth dent 502 is a region in which no electronic element is to be formed, it is possible to improve the surface flatness where the sacrifice growth dent 502 is formed by etching.

The semiconductor wafer 500 needs not include the inhibition member 114 that is located on the side wall of the sacrifice growth dent 502. When no inhibition member 114 is located on the side wall of the sacrifice growth dent 502, the materials of the semiconductor crystals are also adsorbed to the side wall of the sacrifice growth dent 502 to form semiconductor films.

Figure 2:
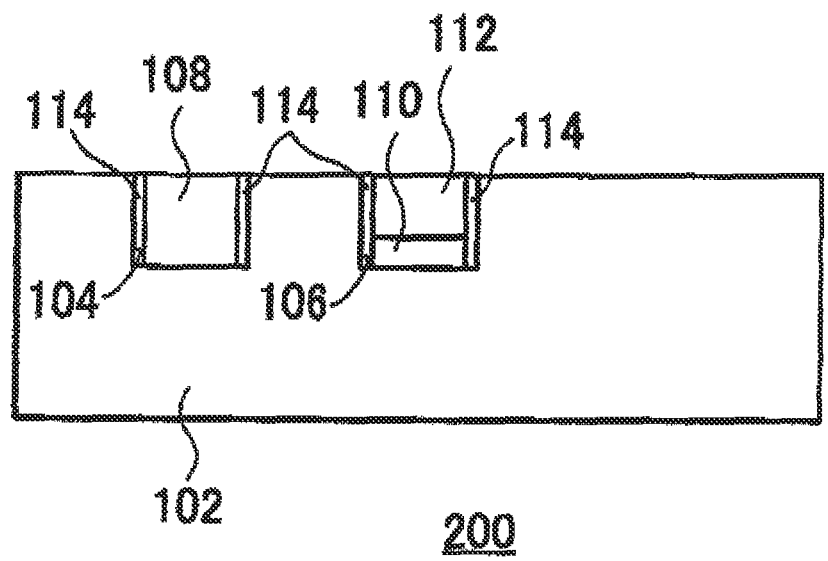
FIG. 2 shows an example of a cross section of a semiconductor wafer 200.

FIG. 2 shows the configuration of a semiconductor wafer 200 according to another embodiment. As shown in FIG. 2, the semiconductor wafer 200 is different from the semiconductor wafer 100 shown in FIG. 1A in having a first dent 104 and a second dent 106 that have substantially the same depth. In the semiconductor wafer 200, the second Group IVB semiconductor crystal 110 is thinner than the first Group IVB semiconductor crystal 108. The thickness of the first Group IVB semiconductor crystal 108 is the same as the total of the thickness of the second Group IVB semiconductor crystal 110 and that of the Group III-V compound semiconductor crystal 112.

Figure 3:
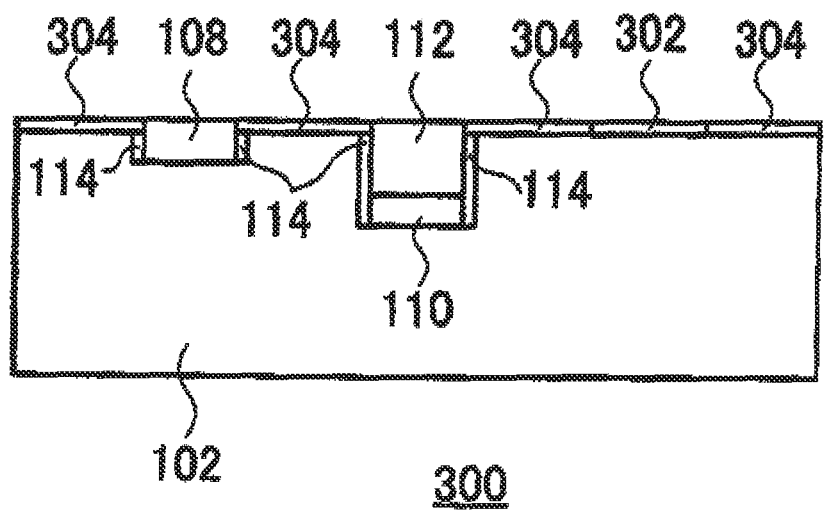
FIG. 3 shows an example of a cross section of a semiconductor wafer 300.

FIG. 3 shows the configuration of a semiconductor wafer 300 according to another embodiment. As shown in FIG. 3, the semiconductor wafer 300 is different from the semiconductor wafer 100 shown in FIG. 1A in including a third Group IVB semiconductor crystal 302 that is formed in a region in the silicon crystal in the surface of the base wafer 102 that is different from the regions in which the first dent 104 and the second dent 106 are formed.

A method for forming the third Group IVB semiconductor crystal 302 may be by forming on a wafer having a silicon crystal in the surface thereof, an inhibition member 304 that inhibits growth of a semiconductor crystal, forming in the inhibition member 304 an opening leading to the silicon crystal, and forming the third Group IVB semiconductor crystal 302 in the opening by a selective MOCVD method. The third Group IVB semiconductor crystal 302 may be a crystal of $Si_{1-b}Ge_b$ ($0 \leq b \leq 1$). The third Group IVB semiconductor crystal 302 may be a Si crystal. It is possible to form a high-performance semiconductor circuit by forming a Si device including a Si crystal as its active layer and combining the Si device with an element that includes a Ge crystal as its active layer and an element that includes a GaAs crystal as its active layer.

Figure 4A:
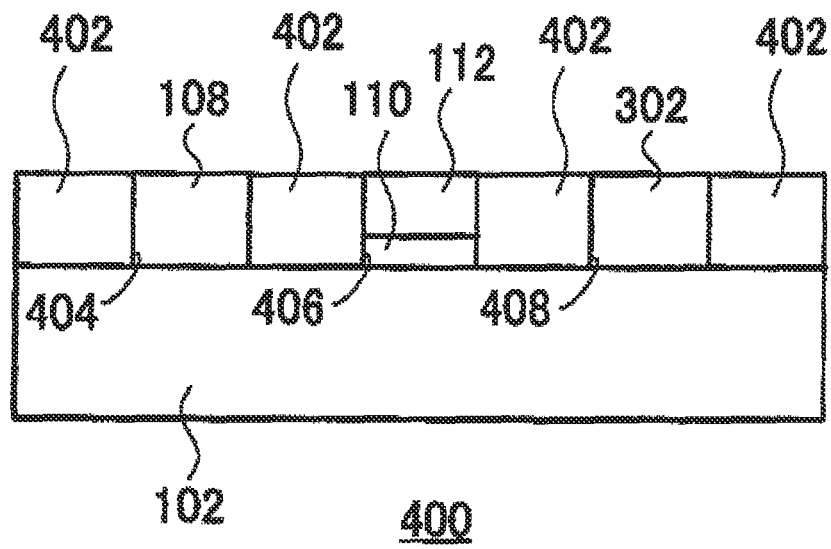
FIG. 4A shows an example of a cross section of a semiconductor wafer 400.
Figure 4B:
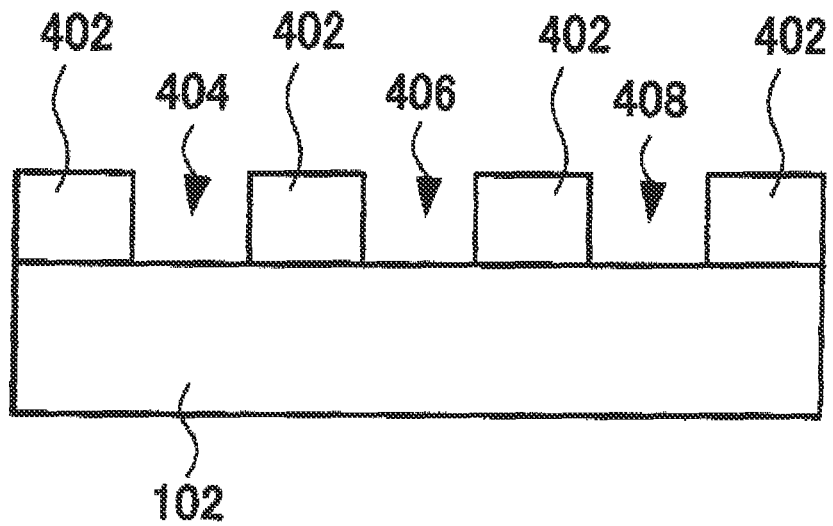
FIG. 4B shows an example of a cross section of the semiconductor wafer 400 during a production process.
Figure 4C:
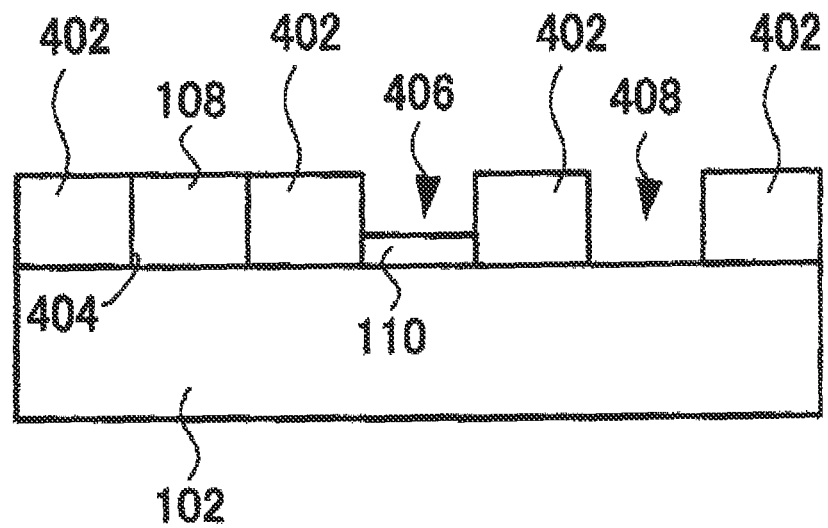
FIG. 4C shows an example of a cross section of the semiconductor wafer 100 during the production process.
Figure 4D:
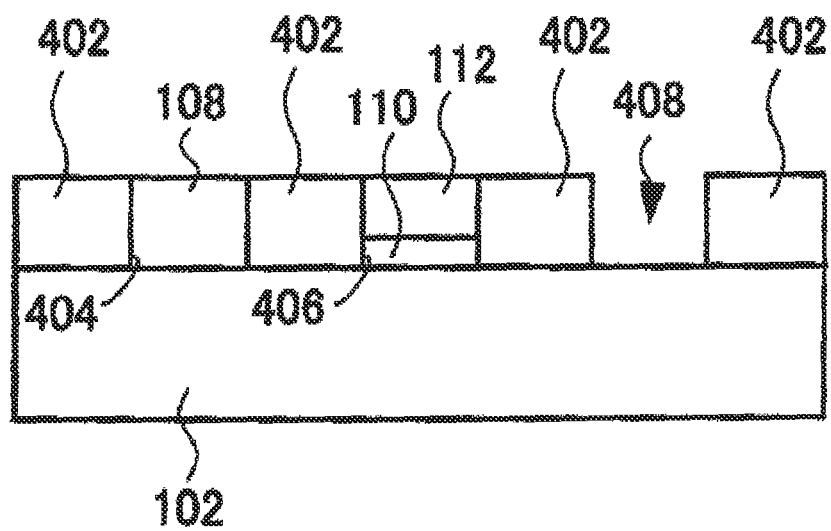
FIG. 4D shows an example of a cross section of the semiconductor wafer during the production process.

FIG. 4A shows an example of a cross section of a semiconductor wafer 400 according to another embodiment. FIG. 4B to FIG. 4D show examples of cross sections of the semiconductor wafer 400 during a production process. The semiconductor wafer 400 includes a base wafer 102, an inhibition member 402, a first Group IVB semiconductor crystal 108, a second Group IVB semiconductor crystal 110, a Group III-V compound semiconductor crystal 112, and a third Group IVB semiconductor crystal 302. Because the base wafer 102, the first Group IVB semiconductor crystal 108, the second Group IVB semiconductor crystal 110, the Group III-V compound semiconductor crystal 112, and the third Group IVB semiconductor crystal 302 of the semiconductor wafer 400 are the same as described in relation with FIG. 1A, description about them, will not be provided.

The inhibition member 402 is formed on the base wafer 102. The inhibition member 402 inhibits growth of a semiconductor crystal. The inhibition member 402 is made of, for example, silicon oxide ($SiO_2$). The inhibition member 402 has a first opening 404 leading to the silicon crystal of the base wafer 102, a second opening 406 leading to the silicon crystal of the base wafer 102, and a third opening 408 leading to the silicon crystal of the base wafer 102. The first Group IVB semiconductor crystal 108 is formed in the first opening 404, the second Group IVB semiconductor crystal 110 is formed in the second opening 406, the Group III-V compound semiconductor crystal 112 is formed above the second Group IVB semiconductor crystal 110 in the second opening 406, and the third Group IVB semiconductor crystal 302 is formed in the third opening 408.

It is preferable that the surface of the third Group IVB semiconductor crystal 302, the surface of the first Group IVB semiconductor crystal 108, and the surface of the Group III-V compound semiconductor crystal 112 be located on substantially the same plane. In this case, the second Group IVB semiconductor crystal 110 is thinner than the first Group IVB semiconductor crystal 108. The thickness of the first Group IVB semiconductor crystal 108 and that of the third group IVB semiconductor crystal 302 are the same as the total of the thickness of the second Group IVB semiconductor crystal 110 and that of the Group III-V compound semiconductor crystal 112.

The method for producing the semiconductor wafer 400 will be described with reference to FIG. 4B to FIG. 4D. As shown in FIG. 4B, the inhibition member 402 is formed on the base wafer 102. The first opening 404 leading to the silicon crystal, the second opening 406 leading to the silicon crystal, and the third opening 408 leading to the silicon crystal are formed in the inhibition member 402. The inhibition member 402 is made of, for example, silicon oxide ($SiO_2$). The inhibition member 402 is formed by, for example, using a CVD method. The first opening 404, the second opening 406, and the third opening 408 are formed by, for example, a photolithography method.

Next, as shown in FIG. 4C, the first Group IVB semiconductor crystal 108 is formed in the first opening 404, and the second Group IVB semiconductor crystal 110 is formed in the second opening 406. For example, it is possible to epitaxially grow the first Group IVB semiconductor crystal 108 and the second Group IVB semiconductor crustal 110 by a MOCVD method or a MBE method (Molecular Beam Epitaxy method). When the composition of the first Group IVB semiconductor crystal 108 and that of the second Group IVB semiconductor crystal 110 are different, the first Group IVB semiconductor crystal 108 may be grown in the first opening 404 by a first step of MOCVD, and then the second Group IVB semiconductor crystal 110 may be grown in the second opening 406 by a second step of MOCVD.

Then, as shown in FIG. 4D, the Group III-V compound semiconductor crystal 112 is formed above the second Group IVB semiconductor crystal 110 in the second opening 406. After this, the third Group IVB semiconductor crystal 302 is grown in the third opening 408, whereby the semiconductor wafer 400 is completed.

The inhibition member 402 may have a sacrifice growth opening that has the same function as the sacrifice growth dent 502 shown in FIG. 1F. In this sacrifice growth opening, a semiconductor to be formed simultaneously with the first Group IVB semiconductor crystal 108, the second Group IVB semiconductor crystal 110, or the Group III-V compound semiconductor crystal 112 is formed. By the inhibition member 402 having the sacrifice growth, opening, it becomes easy to control the epitaxial growth speed, which makes it easy to align the height of the surface of the first Group IVB semiconductor crystal 108, the surface of the third Group IVB semiconductor crystal 302, and the surface of the Group III-V Compound semiconductor crystal 112 with the height of the surface of the silicon crystal. As a result, it is possible to improve the surface flatness of the semiconductor wafer 500 without removing the first Group IVB semiconductor crystal 108, the third Group IVB semiconductor crystal 302, and the Group III-V compound semiconductor crystal 112 by etching or a CMP method.

The present invention will now be described in detail based on examples. However, the present invention is not limited to these examples.

Example 1

A silicon Wafer is prepared as the base wafer 102 having a silicon crystal in the surface thereof. A first dent (first dent 104) and a second dent (second dent 106) are formed in the silicon crystal of the base material 102 by a process using a photolithography method. The size of the dents is 20 µm×20 µm. The depth of the second dent is 3 µm. The depth of the first dent is 1 µm, which is smaller than the depth of the second dent.

Silicon oxide to become the inhibition member 114 and the inhibition member 116 is formed by a CVD method all over the wafer in which the first dent and the second dent have been formed. Hence, the silicon oxide is formed on the bottom planes and side planes of the first dent and second dent. Next, a plurality of openings in which the silicon crystal is exposed are formed in the silicon oxide located on the bottom planes of the first dent and second dent by a process using a photolithography method.

The base wafer 102 is placed inside a reacting furnace, and a Ge crystal to become the first Group IVB semiconductor crystal 108 and the second Group IVB semiconductor crystal 110 is formed in the first dent and the second dent respectively. The Ge crystal is selectively formed in the openings of the first dent and second dent by a CVD method. The Ge crystal is formed to have a thickness of 1 µm by using germane as a material gas, and setting the pressure inside the reacting furnace to 2.6 kPa and the growth temperature to 600° C. Next, the Ge crystal is annealed in the reacting furnace. After annealing is performed by setting the temperature to 800° C. and setting the annealing time to 10 minutes, annealing at the temperature of 680° C. and for the annealing time of 10 minutes is repeated ten times.

Next, a silicon oxide to become the inhibition member 116 is formed all over the base wafer 102 by a CVD method. An opening in which the Ge crystal which is the second Group IVB semiconductor crystal 110 is exposed is formed by a process using a photolithography. A GaAs crystal to become the Group III-V compound semiconductor crystal 112 is formed above the exposed Ge crystal by a MOCVD method. The GaAs crystal is grown by using trimethyl gallium and amine as the material gas. The GaAs crystal is formed to have a thickness of 2 µm by firstly growing a GaAs crystal at a growth temperature of 550° C., and then setting the growth temperature to 650° C. and the pressure inside the reacting furnace to 8.0 kPa. The GaAs crystal is grown above the surface of the Ge crystal in the opening of the second dent.

Next, the silicon oxide located on the surface of the wafer is removed. In this way, it is possible to produce a semiconductor wafer in which the surface of the silicon crystal of the base wafer 102, the surface of the Ge crystal which is the first Group IVB semiconductor crystal 108, and the surface of the GaAs crystal which is the Group III-V compound semiconductor crystal 112 are located on the same plane. In this way, all of the crystals are formed as good-quality crystals having few defects. It is possible to confirm that they are good-quality crystals having few defects, by observing the cross sections of these crystals by a transmission electron microscope.

Example 2

A silicon wafer is prepared as the base wafer 102 having a silicon crystal in the surface thereof. A first dent (first dent 104) and a second dent (second dent 106) are formed in the silicon crystal of the base wafer 102 by a process using a photolithography. The size of the dents is 20 µm×20 µm. The depths of the first dent and second dent are equal 3 µm.

A silicon oxide to become the inhibition member 114 and the inhibition member 116 is formed by a CVD method all over the base wafer 102 in which the first dent and the second dent have been formed. Hence, the silicon oxide is formed on the bottom planes and side planes of the first dent and second dent. Next, a plurality of openings in which the silicon crystal is exposed are formed in the inhibition member located on the bottom planes of the first dent and second dent.

The wafer is placed inside a reacting furnace, and a Ge crystal to become the first Group IVB semiconductor crystal 108 and the second Group IVB semiconductor crystal 110 is formed in the first dent and the second dent respectively. The Ge crystal is selectively formed in the openings of the first dent and second dent. The Ge crystal is formed to have a thickness of 3 µm by using germane as the material gas and setting the pressure in the reacting furnace to 2.6 kPa and the growth temperature to 600° C. Next, the Ge crystal is annealed in the reacting furnace. After annealing is performed by setting the temperature to 800° C. and setting the annealing time to 10 minutes, annealing at the temperature of 680° C. for the annealing time of 10 minutes is repeated ten times.

The Ge crystal selectively formed in the first dent is the first Group IVB semiconductor crystal 108. The Ge crystal selectively formed in the second dent is processed to have a thickness of 1 µm which is smaller than the thickness of the first Group IVB semiconductor crystal 108. The Ge crystal having the thickness of 1 µm is the second Group IVB semiconductor crystal 110.

Next, a silicon oxide to become the inhibition member 116 is formed all over the wafer by a CVD method. An opening in which the Ge crystal which is the second Group IVB semiconductor crystal 110 is exposed is formed by a process using a photolithography method. A GaAs crystal layer to become the Group III-V compound semiconductor crystal 112 is formed above the exposed Ge crystal by a MOCVD method. The GaAs crystal is grown by using trimethyl gallium and arsine as the material gas. The GaAs crystal is formed to have a thickness of 2 µm by firstly growing a GaAs crystal at a growth temperature of 550° C., and then setting the growth temperature to 650° C. and the pressure in the reacting furnace to 8.0 kPa. The GaAs crystal is grown above the surface of the Ge crystal in the opening.

Next, the silicon oxide located on the surface of the wafer is removed. In this way, it is possible to produce a semiconductor wafer in which the surface of the silicon crystal of the base wafer 102, the surface of the Ge crystal which is the first Group IVB semiconductor crystal 108, and the surface of the GaAs crystal which is the Group III-V compound semiconductor crystal 112 are located on the same plane. In this way, all of the crystals are formed as good-quality crystals having few defects. It is possible to confirm that they are good-quality crystals having few defects, by observing the cross sections of these crystals by a transmission electron microscope.

Example 3

A silicon wafer is prepared as the base wafer 102 having a silicon crystal in the surface thereof. A first dent (first dent 104) and a second dent (second dent 106) are formed in the silicon crystal of the base wafer 102 by a process using a photolithography method. The size of the dents is 20 µm×20

μm. The depth of the second dent is 3 μm. The depth of the first dent is 1 μm, which is smaller than the depth of the second dent.

A silicon oxide to become the inhibition member 114 and the inhibition member 116 is formed by a CVD method to have a thickness of 0.1 μm all over the base wafer 102 in which the first dent and the second dent have been formed. Hence, the silicon oxide is formed on the bottom planes and the side planes of the first dent and second dent. Next, a plurality of openings in which the silicon crystal is exposed are formed in the inhibition member located on the bottom planes of the first dent and second dent.

The base wafer 102 is placed inside a reacting furnace, and a Ge crystal to become the first Group IVB semiconductor crystal 108 and the second Group IVB semiconductor crystal 110 is formed in the first dent and the second dent respectively. The Ge crystal is selectively formed in the openings of the first dent and second dent by a CVD method. The Ge crystal is formed to have a thickness of 1.1 μm by using germane as the reaction gas, and setting the pressure inside the reacting furnace to 2.6 kPa and the growth temperature to 600° C. Next, the Ge crystal is annealed in the reacting furnace. After annealing is performed by setting the temperature to 800° C. and the annealing time to 10 minutes, annealing at the temperature of 680° C. and for the annealing time of 10 minutes is repeated ten times.

Next, a silicon oxide to become the inhibition member 116 is formed to have a thickness of 0.1 μm all over the base wafer 102 by a CVD method. An opening in which the Ge crystal layer which is the second Group IVB semiconductor crystal 110 is exposed is formed by a process using a photolithography. A GaAs crystal to become the Group III-V compound semiconductor crystal 112 is formed above the exposed Ge crystal which is the second Group IVB semiconductor crystal 110 by a MOCVD method. The GaAs crystal is grown by using trimethyl gallium and arsine as the material gas. The GaAs crystal is formed to have a thickness of 2 μm by firstly growing a GaAs crystal at a growth temperature of 550° C., and then setting the growth temperature to 650° C. and the pressure inside the reacting furnace to 8.0 kPa. The GaAs crystal is grown above the surface of the Ge crystal in the opening.

Next, a silicon oxide to become the inhibition member 304 is formed by a CVD method, and the entire surface of the wafer is planarized to a flat surface by a process using a photolithography. The silicon oxide to be formed on the Ge crystal which is the first Group IVB semiconductor crystal 108 and on the GaAs crystal which is the Group III-V compound semiconductor crystal 112 is formed to have a thickness of 0.1 μm, and the silicon oxide to be formed on the silicon crystal is formed to have a thickness of 0.2 μm.

Next, an opening leading to the silicon crystal of the base wafer 102 is formed in a portion of the silicon oxide which is the inhibition member 304, in order to form a silicon crystal to become the third Group IVB semiconductor crystal 302. The silicon crystal to become the third Group IVB semiconductor crystal 302 is formed by a CVD method in the opening in which the silicon crystal of the base wafer 102 is exposed. This silicon crystal is formed to have a thickness of 0.1 μm by using monosilane as the material gas and setting the pressure inside the reacting furnace to 1.3 kPa and the growth temperature to 750° C. The silicon crystal to become the third Group IVB semiconductor crystal 302 is grown on the surface of the silicon crystal of the base wafer 102 in the opening formed in the silicon oxide which is the inhibition member 304.

Next, the silicon oxide located on the surface of the wafer is removed by a thickness of 0.1 μm by a process using a photolithography method such that the Ge crystal which is the first Group IVB semiconductor crystal 108 and the GaAs crystal which is the Group III-V compound semiconductor crystal 112 are exposed. In this way, it is possible to produce a semiconductor wafer in which the surface of the Ge crystal which is the first Group IVB semiconductor crystal 108, the surface of the silicon crystal which is the third Group IVB semiconductor crystal 302, and the surface of the GaAs crystal which is the Group III-V compound semiconductor crystal 112 are located on the same plane. In this way, all of the crystals can be obtained as good-quality crystals having few defects. It is possible to confirm that they are good-quality crystals having few defects, by observing the cross sections of these crystals by a transmission electron microscope.

Example 4

A silicon wafer is prepared as the base wafer 102 having a silicon crystal in the surface thereof. A silicon oxide to become an inhibition member 402 is formed all over the surface of the wafer to have a thickness of 2 μm by a thermal oxidation method. A plurality of first and second openings leading to the silicon crystal are formed in portions of the silicon oxide which is the inhibition member 402 by a process using a photolithography method. The method of etching the silicon oxide for forming the openings may be dry-etching the silicon oxide to leave a thickness of 0.1 μm, and then removing the silicon oxide having the remaining thickness of 0.1 μm by wet-etching. In this way, openings in which the silicon crystal is exposed are formed. The size of the openings is 24 μm×20 μm.

The base wafer 102 is placed inside a reacting furnace, and a Ge crystal is formed in the first opening and the second opening. The Ge crystal is selectively formed in the first opening and the second opening. The Ge crystal is formed to have a thickness of 2 μm by using germane as the material gas, and setting the pressure inside the reacting furnace to 2.6 kPa and the growth temperature to 600° C. Next, the Ge crystal is annealed in the reacting furnace. After annealing is performed by setting the temperature to 800° C. and the annealing time to 10 minutes, annealing at the temperature of 680° C. and for the annealing time of 10 minutes is repeated ten times.

The Ge crystal selectively formed in the first opening is the first Group IVB semiconductor crystal 108. The Ge crystal selectively formed in the second opening is processed to have a thickness of 1 μm by a photolithography method. The Ge crystal processed to have a thickness of 1 μm is the second Group IVB semiconductor crystal 110.

Next, a silicon oxide to become the inhibition member is formed all over the surface of the base wafer 102 to have a thickness of 0.1 μm. An opening in which the Ge crystal which is the second Group IVB semiconductor crystal 110 is exposed is formed by a process using a photolithography method. A GaAs crystal to become the Group III-V compound silicon crystal 112 is formed above the exposed Ge crystal by a MOCVD method. The GaAs crystal is grown by using trimethyl gallium and arsine as the material gas. The GaAs crystal is formed to have a thickness of 1 μm by firstly growing a GaAs crystal at a growth temperature of 550° C., and then setting the growth temperature to 650° C. and the pressure inside the reacting furnace to 8.0 kPa. The GaAs crystal is grown above the surface of the Ge crystal in the opening, Next, a silicon oxide to become an inhibition member is formed by a CVD method, and the entire surface of the base wafer 102 is planarized to a flat surface by a process using a photolithography. The silicon oxide to be formed on the Ge crystal which is the first Group IVB semiconductor crystal 108 and on the GaAs crystal which is the Group III-V compound semiconductor crystal 112 is formed to have a thickness of 0.1 μm, and the silicon oxide to be formed on the silicon crystal is formed to have a thickness of 2.1 μm.

Next, a third opening leading to the silicon crystal of the silicon wafer is formed in a portion of the inhibition member, in order to form a silicon crystal to become the third Group IVB semiconductor crystal 302. The method of etching the silicon oxide for forming the opening may be dry-etching the silicon oxide to leave a thickness of 0.1 μm, and then wet-etching the silicon oxide having the remaining thickness of 0.1 μm, to form the opening in which the silicon crystal of the base wafer 102 is exposed.

A silicon crystal to become the third Group IVB semiconductor crystal 302 is formed by a CVD method in the third opening in which the silicon crystal is exposed. This silicon crystal is formed to have a thickness of 2 μm by using monosilane as the material gas, and setting the pressure inside the reacting furnace to 1.3 kPa and the growth temperature to 750° C. The silicon crystal which is the third Group IVB semiconductor crystal 302 is grown above the surface of the silicon crystal in the opening formed in the silicon oxide which is the inhibition member 402.

Next, the silicon oxide located on the surface of the wafer is removed by a thickness of 0.1 μm by a process using a photolithography such that the Ge crystal which is the first Group IVB semiconductor crystal 108 and the GaAs crystal which is the Group III-V compound semiconductor crystal 112 are exposed. In this way, it is possible to produce a semiconductor wafer in which the surface of the Ge crystal which is the first Group IVB semiconductor crystal 108, the surface of the silicon crystal which is the third Group IVB semiconductor crystal 302, and the surface of the GaAs crystal which is the Group III-V compound semiconductor crystal 112 are located on the same plane. In this way, all of the crystals can be obtained as good-quality crystals having few defects. It is possible to confirm that they are good-quality crystals having few defects, by observing the cross sections of these crystals by a transmission electron microscope.

It is possible to form an electronic element by using the silicon crystal, any semiconductor crystal among the Group IVB semiconductor crystals and the Group III-V compound semiconductor crystal 112 or a semiconductor layer formed on that semiconductor crystal, which are included in the semiconductor wafer 100, the semiconductor wafer 200, the semiconductor wafer 300, the semiconductor wafer 400, and the semiconductor wafer 500 described above. Examples of electronic elements include an analog amplification device including an FET or an HBT, a switching device and a digital IC which include an FET or an HBT, a light emitting device having a pn junction, and a light receiving device having a pn junction or a Schottky junction. These electronic elements can be integrated on a single silicon wafer monolithically.

The processes of the wafer, operations in a method, procedures, steps, and stages shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor wafer, comprising:
   a base wafer having a silicon crystal in a surface thereof, the silicon crystal having a first dent and a second dent;
   a first Group IVB semiconductor crystal located in the first dent and exposed;
   a second Group IVB semiconductor crystal located in the second dent; and
   a Group III-V compound semiconductor crystal located above the second Group IVB semiconductor crystal in the second dent and exposed.

2. semiconductor wafer according to claim 1, wherein the first Group IVB semiconductor crystal is a crystal of $Si_{1-a1}Ge_{a1}$ ($0 \leq a1 \leq 1$), and the second Group IVB semiconductor crystal is $Si_{1-a2}Ge_{a2}$ ($0.6 \leq a2 \leq 1$).

3. The semiconductor wafer according to claim 2, wherein a1 and a2 satisfy $a1 \leq a2$.

4. The semiconductor wafer according to claim 1, wherein the surface of the silicon crystal, the surface of the first Group IVB semiconductor crystal, and the surface of the Group III-V compound semiconductor crystal are located on substantially the same plane.

5. The semiconductor wafer according to claim 1, wherein the first dent is shallower than the second dent.

6. The semiconductor wafer according to claim 1, wherein the first dent and the second dent are have substantially the same depth, and
   the second Group IVB semiconductor crystal is thinner than the first Group IVB semiconductor crystal.

7. The semiconductor wafer according to claim 1, wherein the aspect ratio of the second dent is $(\sqrt{3})/3$ or higher.

8. The semiconductor wafer according to claim 1 further comprising an inhibition member located between the side wall of the first dent and the first Group IVB semiconductor crystal, the inhibition member inhibiting growth of a semiconductor crystal.

9. The semiconductor wafer according to claim 1 further comprising an inhibition member located between the side wall of the second dent and the second Group IVB semiconductor crystal and between the side wall of the second dent and the Group III-V compound semiconductor crystal, the inhibition member inhibiting growth of a semiconductor crystal.

10. The semiconductor wafer according to claim 1, further comprising a third Group IVB semiconductor crystal that is located on a region of the silicon crystal that is different from regions in which the first dent and the second dent are located.

11. The semiconductor wafer according to claim 10, wherein the third Group IVB semiconductor crystal is $Si_{1-b}Ge_b$ ($0 \leq b \leq 1$).

12. The semiconductor wafer according to claim 1, wherein the Group III-V compound semiconductor crystal is a crystal of $Al_x In_y Ga_{1-x-y} As_z P_{1-z}$ ($0 \leq x \leq 1$, $0 \leq y \leq 1$, $0 \leq x+y \leq 1$, $0 \leq z \leq 1$).

13. A semiconductor wafer comprising:
    a base wafer having a silicon crystal in a surface thereof;
    an inhibition member that is located on the base wafer, has a first opening leading to the silicon crystal, a second opening leading to the silicon crystal, and a third opening leading to the silicon crystal, and inhibits growth of a semiconductor crystal;
    a first Group IVB semiconductor crystal located in the first opening and exposed;
    a second Group IVB semiconductor crystal located in the second opening;

a Group III-V compound semiconductor crystal located above the second Group IVB semiconductor crystal and exposed; and a third Group IVB semiconductor crystal located in the third opening.

14. The semiconductor wafer according to claim 13, wherein the first Group IVB semiconductor crystal is a crystal of $Si_{1-a1}Ge_{a1}$ ($0 \leq a1 \leq 1$), and the second Group IVB semiconductor crystal is a crystal of $Si_{1-a2}Ge_{a2}$ ($0.6 \leq a2 \leq 1$).

15. The semiconductor wafer according to claim 13, wherein the surface of the third Group IVB semiconductor crystal, the surface of the first Group IVB semiconductor crystal, and the surface of the Group III-V compound semiconductor crystal are located on substantially the same plane.

16. The semiconductor wafer according to claim 13, wherein the second Group IVB semiconductor crystal is thinner than the first Group IVB semiconductor crystal.

17. A semiconductor device, comprising an electronic element, the electronic element including:
    any semiconductor crystal among the silicon crystal, the first Group IVB semiconductor crystal, the second Group IVB semiconductor crystal, and the Group III-V compound semiconductor crystal of the semiconductor wafer according to claim 1; and
    an electrode located on the semiconductor crystal or on a semiconductor layer located on the semiconductor crystal.

18. A method for producing a semiconductor wafer, the method comprising;
    forming a first dent and a second dent in a silicon crystal of a base wafer that has the silicon crystal in a surface thereof;
    forming a first Group IVB semiconductor crystal in the first dent;
    forming a second Group IVB semiconductor crystal in the second dent; and
    forming a Group III-V compound semiconductor crystal above the second Group IVB semiconductor crystal in the second dent,
    wherein the first Group IVB semiconductor crystal and the Group III-V compound semiconductor crystal are exposed.

19. The method according to claim 18 for producing a semiconductor wafer,
    wherein the first Group IVB semiconductor crystal is a crystal of $Si_{1-a1}Ge_{a1}$ ($0 \leq a1 \leq 1$), and the second Group IVB semiconductor crystal is a crystal of $Si_{1-a2}Ge_{a2}$ ($0.6 \leq a2 \leq 1$).

20. The method according to claim 18 for producing a semiconductor wafer, the method further comprising
    forming an inhibition member on the surface of the silicon crystal and on the side walls of the first dent and the second dent after forming the first dent and the second dent and before forming the first Group IVB semiconductor crystal and the second Group IVB semiconductor crystal, the inhibition member being to inhibit growth of a semiconductor crystal,
    wherein in the forming the first Group IVB semiconductor crystal and the second Group IVB semiconductor crystal, the first Group IVB semiconductor crystal and the second Group IVB semiconductor crystal are formed by a selective MOCVD method.

21. The method according to claim 18 for producing a semiconductor wafer, the method further comprising
    forming an inhibition member that covers the surface of the first Group IVB semiconductor crystal formed in the first dent and inhibits growth of a semiconductor crystal,
    wherein in the forming the Group compound semiconductor crystal, the Group III-V compound semiconductor crystal is formed by a selective MOCVD method.

22. A method for producing a semiconductor wafer, the method comprising:
    forming an inhibition member on a base wafer having a silicon crystal in a surface thereof, the inhibition member inhibiting growth of a semiconductor crystal;
    forming a first opening, a second opening, and a third opening in the inhibition member, the first opening leading to the silicon crystal, the second opening leading to the silicon crystal, and the third opening leading to the silicon crystal;
    forming a first Group IVB semiconductor crystal in the first opening;
    forming a second Group IVB semiconductor crystal in the second opening;
    fanning a Group III-V compound semiconductor crystal above the second Group IVB semiconductor crystal in the second opening; and
    growing a third Group IVB semiconductor crystal in the third opening,
    wherein the first Group IVB semiconductor crystal, the Group III-V compound semiconductor crystal, and the third Group IVB semiconductor crystal are exposed.

23. The method according to claim 22 for producing a semiconductor wafer,
    wherein the first Group IVB semiconductor crystal is a crystal of $Si_{1-a1}Ge_{a1}$ ($0 \leq a1 \leq 1$), and the second Group IVB semiconductor crystal is a crystal of $Si_{1-a2}Ge_{a2}$ ($0.6 \leq a2 \leq 1$).

24. The method according to claim 22 for producing a semiconductor wafer,
    wherein the third Group IVB semiconductor crystal is a crystal of $Si_{1-b}Ge_{b}$ ($0 \leq b \leq 1$).

* * * * *